United States Patent [19]
Tan et al.

[11] Patent Number: 6,001,706
[45] Date of Patent: Dec. 14, 1999

[54] METHOD FOR MAKING IMPROVED SHALLOW TRENCH ISOLATION FOR SEMICONDUCTOR INTEGRATED CIRCUITS

[75] Inventors: Poh Suan Tan, Singapore, Singapore; Lap Chan, San Franciso, Calif.; Qinghua Zhong; Qian Gang, both of Singapore, Singapore

[73] Assignee: Chartered Semiconductor Manufacturing, Ltd., Singapore, Singapore

[21] Appl. No.: 08/986,670

[22] Filed: Dec. 8, 1997

[51] Int. Cl.$^6$ ........................................... H01L 21/76
[52] U.S. Cl. ........................... 438/424; 438/228; 438/426
[58] Field of Search ................................. 438/228, 424, 438/425, 426, 427

[56] References Cited

U.S. PATENT DOCUMENTS

| | | | |
|---|---|---|---|
| 5,192,706 | 3/1993 | Rodder | 438/424 |
| 5,521,422 | 5/1996 | Mandelman et al. | 257/510 |
| 5,567,553 | 10/1996 | Hsu et al. | 430/5 |
| 5,580,815 | 12/1996 | Hsu et al. | 438/362 |
| 5,677,229 | 10/1997 | Morita et al. | 438/424 |
| 5,712,185 | 1/1998 | Tsai et al. | 438/424 |
| 5,733,383 | 3/1998 | Fazan et al. | 438/424 |
| 5,786,262 | 7/1998 | Jang et al. | 438/424 |
| 5,795,811 | 8/1998 | Kim et al. | 438/424 |
| 5,801,082 | 9/1998 | Tseng | 438/424 |
| 5,801,083 | 9/1998 | Yu et al. | 438/424 |
| 5,811,346 | 9/1998 | Sur et al. | 438/424 |
| 5,811,347 | 9/1998 | Gardner et al. | 438/424 |
| 5,834,358 | 11/1998 | Pan et al. | 438/424 |
| 5,837,612 | 11/1998 | Ajuria et al. | 438/697 |
| 5,858,858 | 1/1999 | Park et al. | 438/435 |
| 5,902,127 | 5/1999 | Park | 438/435 |

OTHER PUBLICATIONS

Bryant et al. "Characteristics of CMOS Device Isolation for the ULSI Age" IEDM Tech. Dig. pp. 671–674, 1974.

Chatterjee et al. "A Study of Integration Issues in Shallow Trench Isolation for Deep Submioran CMOS Technologies" SPIE, vol. 2875, 1996, pp. 39–47.

*Primary Examiner*—Stephen D. Meier
*Assistant Examiner*—Khanh Duong
*Attorney, Agent, or Firm*—George O. Saile; Rosemary L.S. Pike

[57] ABSTRACT

A method was achieved for fabricating field oxide regions (shallow trench isolation) having raised portions which are self-aligned and extend over edges of device areas. This results in FETs with improved sub-threshold characteristics and lower sub-threshold leakage currents. The method consists of forming a pad oxide and depositing a doped polysilicon layer and a hard mask layer on a silicon substrate. Shallow trenches are etched through the hard mask, doped polysilicon layer and partially into the silicon substrate. A thermal oxidation is used to form a liner oxide in the trenches and to oxidize, at a higher oxidation rate, the sidewalls of the doped polysilicon layer to form an oxide over the edges of the device areas. A gap-fill oxide is deposited in the trenches and chemical mechanical polished (CMP) back to the polysilicon layer. The remaining polysilicon layer over the device areas is selectively removed to provide a field oxide having raised portions formed over the edges of the device areas. This eliminates the wrap-around corner effect which in the prior art resulted in enhanced corner conduction and increased sub-threshold leakage currents at substrate back bias. This improved method also provides greater processing latitude during the chemical mechanical polish step.

20 Claims, 5 Drawing Sheets

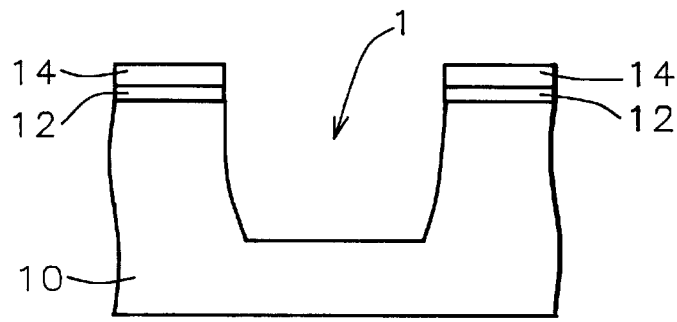
FIG. 1 - Prior Art
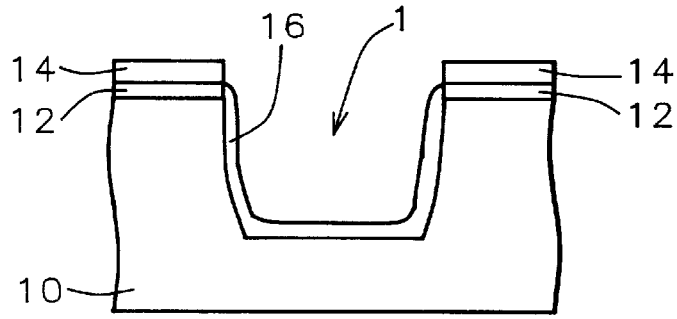
FIG. 2 - Prior Art
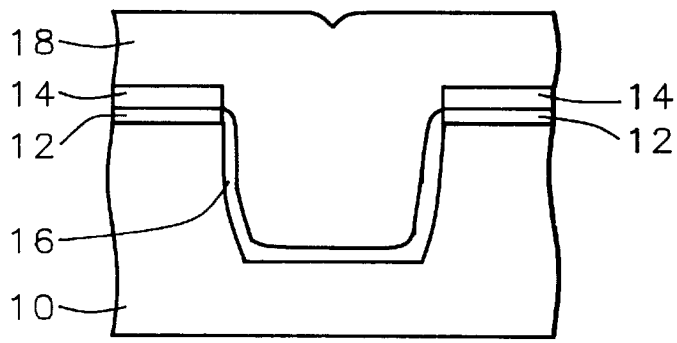
FIG. 3 - Prior Art
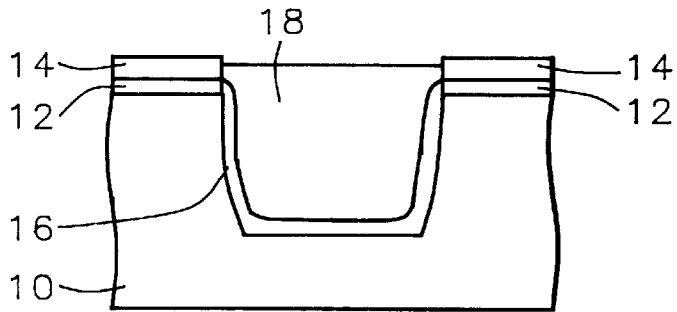
FIG. 4 - Prior Art

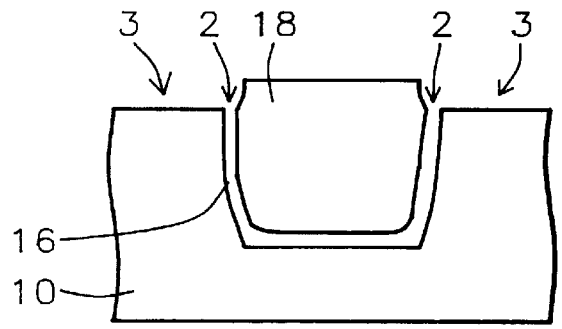
FIG. 5 – Prior Art
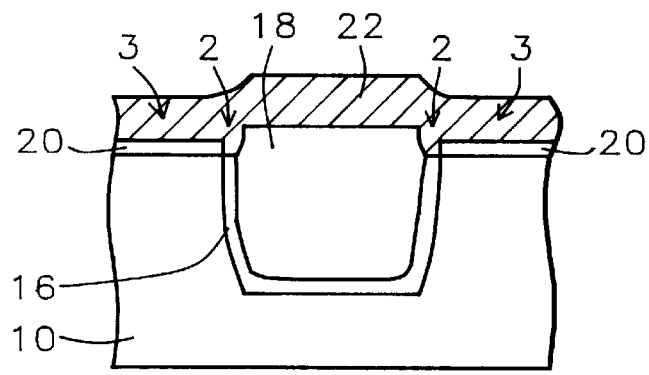
FIG. 6 – Prior Art
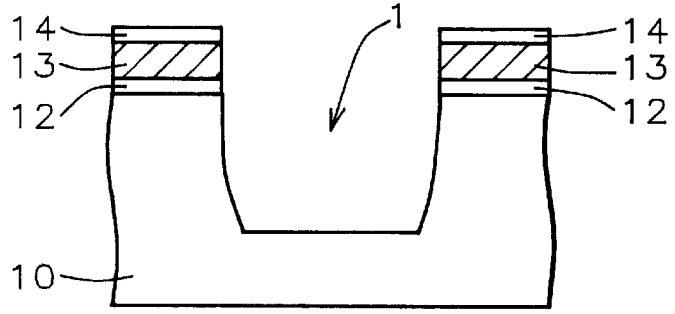
FIG. 7
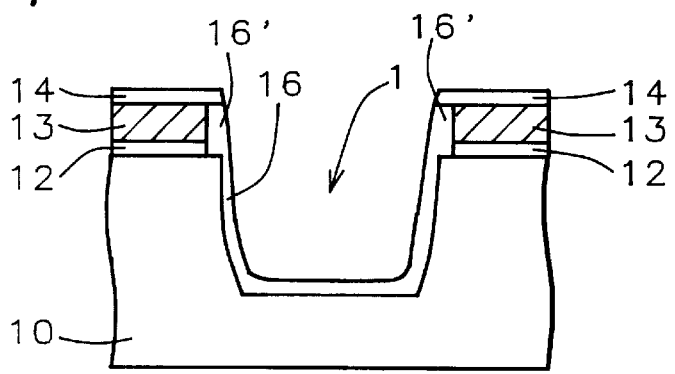
FIG. 8A

METHOD FOR MAKING IMPROVED SHALLOW TRENCH ISOLATION FOR SEMICONDUCTOR INTEGRATED CIRCUITS

BACKGROUND OF THE INVENTION (1) Field of the Invention

The present invention relates to the fabrication of integrated circuits, and more particularly to a method for forming improved shallow trenches which minimizes the wrap-around corner effect that enhances the gate control of the top trench conduction path along the isolation edge between the source and drain, and causes sub-threshold "hump" of $I_d$-$V_G$ curves at substrate back bias.

(2) Description of the Prior Art

Various field oxide (FOX) isolations are used to electrically isolate the discrete semiconductor devices, such as field effect transistors (FETs), formed in and on semiconductor substrates. This FOX is formed on single crystal silicon (Si) for Ultra Large Scale Integration (ULSI) circuit applications. One common method of forming the field oxides in the semiconductor industry is by the local oxidation of silicon (LOCOS) method. LOCOS uses a patterned silicon nitride ($Si_3N_4$) as an oxidation barrier mask and the silicon substrate is selectively oxidized to form the semi-planar isolation. However, this method requires long oxidation times (excessive thermal budgets) and the lateral oxidation under the barrier mask limits the minimum spacing between adjacent active device areas and therefore prevents further increase in device packing density.

In more advanced isolation schemes, to minimize the FOX feature size for ULSI, it is common practice to etch shallow trenches in the silicon substrate which are then filled with a chemical vapor deposited (CVD) silicon oxide ($SiO_2$). The CVD oxide is then either etched back or chemical mechanical polished (CMP) back to form the FOX, which is commonly referred to as Shallow Trench Isolation (STI).

However, there are several problems associated with the conventional or prior art shallow trench isolation methods. These problems are best understood by referring to the prior art shown in FIGS. 1 through 6 in which a sequence of schematic cross-sectional views is shown of the process steps. As shown in FIG. 1, the prior art method starts by forming a stress-release pad oxide ($SiO_2$) layer 12 on the silicon substrate 10, and then depositing a chemical vapor deposited (CVD) silicon nitride ($Si_3N_4$) layer 14. Conventional photolithographic techniques are then used to pattern the silicon nitride layer 14, the pad oxide 12 and to etch trenches 1 in the substrate 10. After removing the photoresist mask (not shown) a liner oxide layer 16 is grown on the exposed silicon surface in the trenches 1 by thermal oxidation, as shown in FIG. 2. A Low Pressure CVD (LPCVD), a Sub-Atmosphere CVD (SACVD), or High-Density Plasma CVD (HDP-CVD) silicon oxide 18 is then deposited to fill the trenches 1, as shown in FIG. 3. Now as shown in FIG. 4, the CVD silicon oxide is etched back or CMP back to the silicon nitride layer 14. Typically the etch back or polish back of the CVD oxide layer 18 to the silicon nitride hard mask 14 is not very selective and it is difficult to control the etch or polish back within the required processing tolerances. Next, as shown in FIG. 5, the silicon nitride layer 14 is selectively removed using a hot phosphoric acid etch, and the pad oxide layer 12 is removed using dilute hydrofluoric (HF) acid to expose the active device areas. Unfortunately this results in a recess 2 in the field oxide at the edge of the device areas 3.

Now as shown in FIG. 6, when the FET gate oxide 20 is grown on the device areas 3, a polysilicon layer 22 is deposited and patterned to form the FET gate electrodes 22. The wrap-around corner effect in the recess 2 at the edge of the device area results in a crowded gate electric field (E) that causes an enhanced corner conduction path along the isolation edge between the source and drain, and results in a subthreshold "hump" of $I_d$-$V_G$ curves at substrate back bias (increase of $I_d$ at low $V_G$). Furthermore, the non-uniformity from the CMP across the substrate results in large variations in the gate threshold voltage ($V_{th}$) due to the variation in electric field (E) FET. The wrap-around corner effect can also increase the sub-threshold current which is also very undesirable for low voltage applications.

Several related references include "Characteristics of CMOS Device Isolation for the ULSI Age," by A. Bryant et al., IEDM Tech. Dig., pages 671–674, 1994, in which the enhanced corner edge conduction is observed at low gate voltages with high substrate doping and back bias. "A Study of Integration Issues in Shallow Trench Isolation for Deep Submicron CMOS Technologies," by A. Chatterjee et al., SPIE, Vol. 2875, pages 39–47, 1996, in which the various process choices for making a shallow trench isolation structure are described, and particularly in relation to forming the liner oxidation for the shallow trench.

Another approach is described in U.S. Pat. No. 5,567,553 by L. L. Hsu et al. in which the gate electrode is patterned to have a wider channel length over the shallow trench edge relative to the channel length between the trench edges. Still another approach is described in U.S. Pat. No. 5,580,815 by T. C. Hsu et al. in which an annealed amorphous silicon layer is used to minimize the encroachment of the field oxide (bird's beak) into the device area. Another approach is described by Mandelman in U.S. Pat. No. 5,521,422 in which gate wrap-around and corner parasitic leakage are prevented by using a sidewall on the shallow trench isolation.

Although there are a number of methods for forming shallow trenches, there is still a strong need to provide an improved method for forming shallow trenches which circumvent the wrap-around corner effect to improve the device reliability.

SUMMARY OF THE INVENTION

It is a principal object of this invention to provide an improved shallow trench isolation (STI) on silicon substrates having sub-threshold hump-free device characteristics by eliminating the wrap-around corner effect that results from the recess in the field oxide after chemical mechanical polish.

It is another object of this invention to provide a poly-silicon hard mask over the device areas that is laterally oxidized to provide a portion of the field oxide extending over the device areas thereby eliminating the wrap-around corner effect. And further also provide greater latitude for the CMP process window.

The method begins by providing a semiconductor substrate composed of a single crystal silicon, which can be either N- or P-doped. A first thermal oxide layer is grown on the substrate surface to provide a stress-release pad oxide layer. A doped polysilicon layer is deposited on the pad oxide layer, for example by low pressure chemical vapor deposition (LPCVD) and then a silicon nitride layer is deposited by LPCVD on the polysilicon layer. Alternatively, the silicon nitride can be omitted. Conventional photolithographic techniques and anisotropic plasma etching are used to etch the silicon nitride layer, the polysilicon layer, pad oxide layer and to partially etch into the silicon substrate to form trenches where the shallow trench isolation (STI) around device areas is required.

Now, by the method of this invention, a second thermal oxidation is carried out to form a liner oxide layer on the exposed surfaces of the silicon substrate in the trenches to eliminate any plasma etch damage. Concurrently the sidewalls of the polysilicon layer are oxidized at a higher oxidation rate (about 2–3 times faster than the silicon substrate), thereby forming a polysilicon oxide that extends over the edge of the device areas. The polysilicon oxide later serves as a portion of the field oxide extending over the device areas and eliminates the wrap-around corner effect that would otherwise result in the more conventional method of forming the field oxide.

Now continuing with the process, a conformal CVD silicon oxide is deposited to fill the trenches to form a gap fill oxide. The CVD oxide is preferably deposited using a LPCVD, a sub-atmosphere CVD (SACVD), or a high-density plasma CVD (HDP-CVD). The gap fill oxide is then chemical mechanical polished back to the silicon nitride layer, and the silicon nitride hard mask is selectively removed in a hot phosphoric acid etch. Alternatively, if the silicon nitride hard mask is not needed for CMP, the gap fill oxide can be CMP back selectivity to the polysilicon, wherein the polish selectivity of the gap fill oxide to polysilicon is between about 6:1 and 10:1. In either approach a larger processing tolerance is achieved than would otherwise be possible with a single silicon nitride hard mask as in the prior art.

The polysilicon layer is then removed by using a selective plasma etch, for example using an etchant gas containing chlorine species or in a wet etch using potassium hydroxide (KOH) or isopropanol alcohol (IPA) mixed with KOH, thereby completing the shallow trench isolation having raised field oxide regions extending over the edge of the device areas. Since the liner oxide formed by thermal oxidation (which includes the oxide on the polysilicon sidewalls) etches at a slower rate than the gap fill oxide during polysilicon etch removal, the portion of the field oxide over the edge of device areas remains to prevent the unwanted wrap-around corner effect. The thin pad oxide is then removed by a dilute HF acid. A gate oxide is grown on the exposed device areas and a second polysilicon layer is deposited and patterned to form the gate electrodes for the FETs.

BRIEF DESCRIPTION OF THE DRAWINGS

The objects and other advantages of this invention are best understood in the preferred embodiment with reference to the attached drawings that include:

FIGS. 1 through 6 are schematic cross-sectional views showing a sequence of steps for forming a shallow trench isolation by the prior art.

FIGS. 7 through 12 are schematic cross-sectional views for a series of steps for fabricating the improved shallow trench isolation, by the method of this invention, with improved threshold voltages.

DESCRIPTION OF THE PREFERRED EMBODIMENT

Figure 8B:
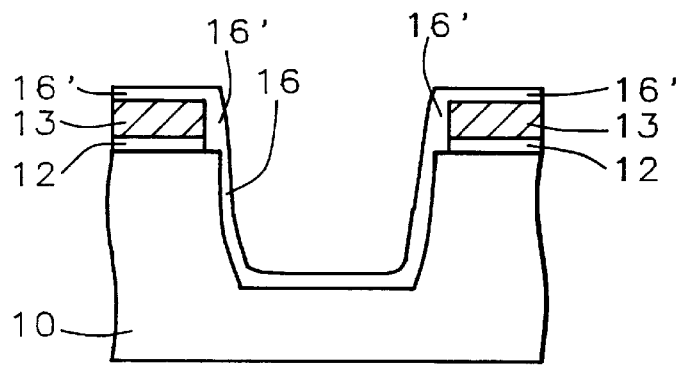

The method for making the shallow trench isolation having field oxide regions extending over and self-aligned to the edges of device areas for eliminating the wrap-around corner effect is now described in detail. Although the method is described for a single shallow trench isolation on a silicon substrate, it should be well understood by one skilled in the art that a multitude of shallow trenches are formed concurrently on the substrate, and further that the trenches can be formed in either P-doped or N-doped substrates. More particularly the improved field oxide isolation can be formed in and on substrates having both P and N wells for forming N-channel and P-channel field effect transistors (FETs) such as are used to fabricate CMOS or Bipolar/CMOS (BiCMOS) circuits.

Referring now to FIG. 7, the method for forming the improved shallow trench isolation starts by providing a silicon substrate 10. The preferred substrate is composed of a single crystal silicon with a preferred <100> crystallographic orientation. A pad oxide 12 is formed on the substrate 10, for example by thermal oxidation in an oxygen ambient. Typically the pad oxide 12 is formed on the substrate surface to provide a stress-release layer to protect the substrate from stress-induced crystalline damage. The pad oxide 12 is preferably formed by subjecting the substrate to a dry oxygen ambient in an oxidation furnace at a temperature of between about 850 and 1000° C. The pad oxide is preferably grown to a thickness of between about 50 and 400 Angstroms, and more specifically to a thickness of about 200 Angstroms.

Next, also shown in FIG. 7, a polysilicon layer 13 is deposited on the pad oxide layer 12. The polysilicon layer 13 can be deposited by low pressure chemical vapor deposition (LPCVD) using a reactant gas such as silane ($SiH_4$) and in a temperature range of between about 600 and 650° C. The polysilicon layer 13 is deposited to a preferred thickness of between about 1000 and 3000 Angstroms. To enhance the oxidation rate of layer 13, which is important to the method of the invention, the polysilicon layer 13 is doped by ion implantation or alternatively can be doped in situ during the polysilicon deposition. Preferably layer 13 is doped with phosphorus (P) to a concentration of between about $5.0 \text{ E } 19$ and $5.0 \text{ E } 20$ atoms/$cm^3$.

Next a hard mask layer 14 is deposited on the polysilicon layer 13. Preferably layer 14 is composed of silicon nitride ($Si_3N_4$). For example the $Si_3N_4$ can be deposited by LPCVD using a reactant gas mixture, such as silane ($SiH_4$) and ammonia ($NH_3$) and is deposited at a temperature of between about 650 and 800° C. Alternatively, layer 14 can be a silicon oxide ($SiO_2$), for example deposited by LPCVD using TEOS and ozone as the reactant gas. The $Si_3N_4$ layer 14 is deposited to a preferred thickness of between about 1000 and 3000 Angstroms.

Still referring to FIG. 7, conventional photolithographic techniques and anisotropic plasma etching are then used to etch trenches 1 through the multilayer composed of layers 14, 13 and 12 and partially into the silicon substrate 10 where the field oxide (shallow trench isolation) surrounding device areas 2 is required. The trenches are formed having essentially vertical sidewalls, and are preferably etched using a reactive ion etcher (RIE) or a high-density plasma (HDP) etcher. The preferred etchant gas mixture for the $Si_3N_4$ layer is sulphur hexafluoride ($SF_6$), trifluoromethane ($CHF_3$), and helium (He) as the main etchant gases, and hydrogen bromide (HBr), $SF_6$, and oxygen ($O_2$) is the gas mixture for the overetch. The preferred etchant gas mixture for etching the polysilicon is carbon tetrafluoride ($CF_4$) and He as the break-through etch, and a gas mixture of HBr/$Cl_2$/He/$O_2$ as the main etching gas. Preferably the trenches are etched to a depth of 0.3 to 1.0 micrometers (um) as measured from the silicon substrate 10 surface.

Now as shown in FIG. 8A, a liner oxide layer 16 is formed by thermal oxidation on the exposed silicon substrate 10 in the trenches 1, and concurrently a thicker sidewall oxide 16' is grown on the sidewalls of the polysilicon layer 13. Typically the oxidation rate of the polysilicon is between about 2 and 3 times faster than the oxidation rate of the single crystal silicon This is an important feature of the invention, because as will later be seen, this provides a thicker self-aligned silicon oxide extending over the edge of the device areas 3 that prevents the wrap-around corner effect from occurring. Preferably the liner oxide 16 on the single crystal silicon is grown to a thickness of between about 300 and 500 Angstroms while the polysilicon sidewall oxide 16' grows to a thickness of between about 600 and 1500 Angstroms. More specifically, when the liner oxide 16 is grown to a thickness of 400 Angstroms, the polysilicon oxide 16' grows to a thickness of about 800 Angstroms. Alternatively, as shown in FIG. 8B, the $Si_3N_4$ hard mask 14 can be removed, for example, using a hot phosphoric acid etch, and then the liner oxide 16 can be grown by thermal oxidation while a thicker oxide layer 16' is grown on the polysilicon layer 13, as depicted in FIG. 8B. Preferably the thermal oxidation, in either approach, is achieved in an oxidation furnace by performing a dry oxidation in oxygen at a temperature of between about 900 and 1050° C.

Figure 13:
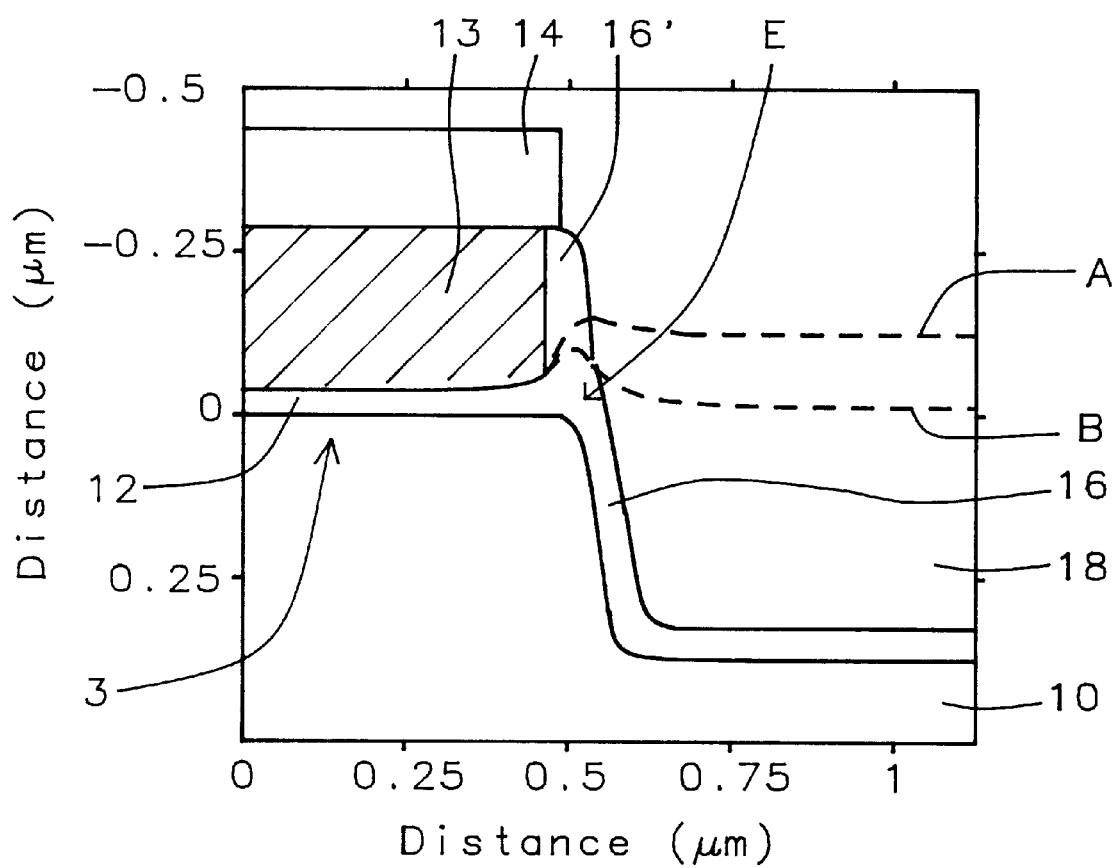
FIG. 13 shows a schematic cross-sectional view of a computer-simulated profile showing the formation of the polysilicon oxide extending over the device area during the formation of liner oxide. The broken lines depict the profile of the field oxide after CMP and polysilicon etch.

To better appreciate the advantages of the invention, an enlarged schematic cross-sectional view of the results of a computer simulation is shown in FIG. 13 for one corner (edge) of the trenches 1 after the thermal oxidation to form the liner oxide 16 and the polysilicon oxide 16'. The $Si_3N_4$ layer 14 is about 1500 Angstroms, the polysilicon layer 13 is about 2550 Angstroms and is doped with phosphorus (P) to a concentration of about 2.0 E 20 atoms/cm$^3$ using an implant dose of 5 E 15 and implant energy of 40 KeV. After a 1000° C. dry oxidation for 55 minutes, the liner oxide is about 450 Angstroms thick, and the poly-silicon oxide 16' is about 800 Angstroms thick. But more importantly, the polysilicon oxide 16' extends over the edge E of the device area and forms a portion of field oxide 18 over the device area edge E, as will become clear in the continuing process description.

Figure 9A:
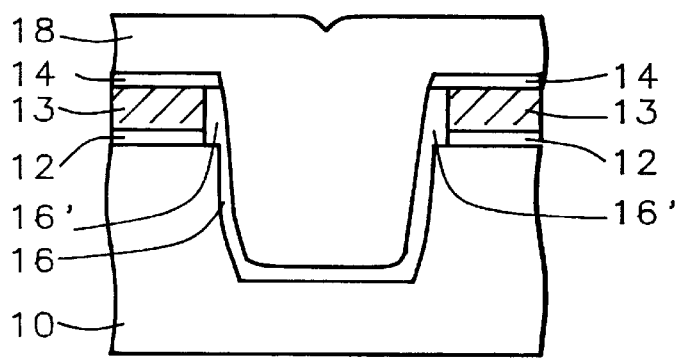
Figure 9B:
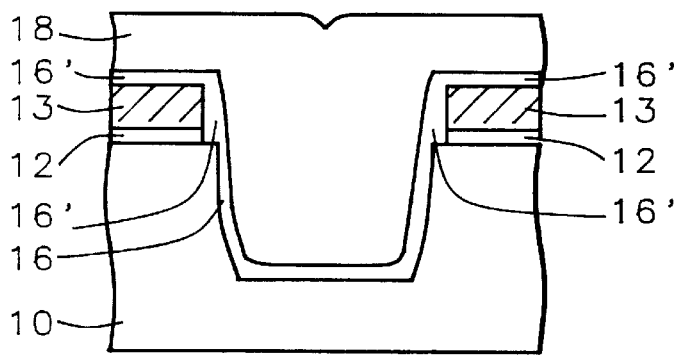

Continuing with the process, and as depicted in FIG. 9A, a conformal CVD silicon oxide is deposited to a thickness sufficient to completely fill the trenches 1 and form a gap fill oxide 18. The corresponding structure for the alternate approach without the $Si_3N_4$ hard mask is shown in FIG. 9B. The gap fill oxide 18 is preferably deposited using LPCVD, sub-atmosphere CVD (SACVD) or a High-Density Plasma-CVD (HDP-CVD) and a reactant gas such as tetraethosiloxane (TEOS). The layer 18 is deposited to a thickness that is greater than the trench depth, but is typically deposited to a thickness of between about 6000 and 10000 Angstroms.

Figure 10A:
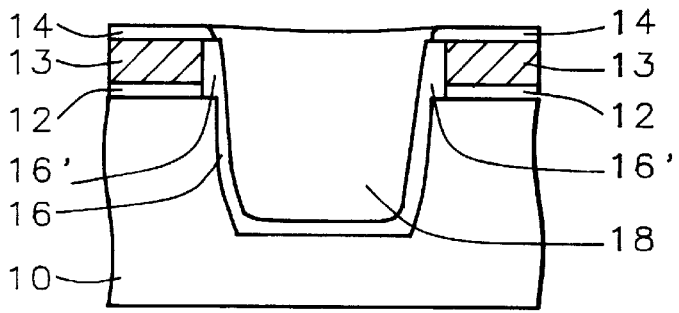
Figure 10B:
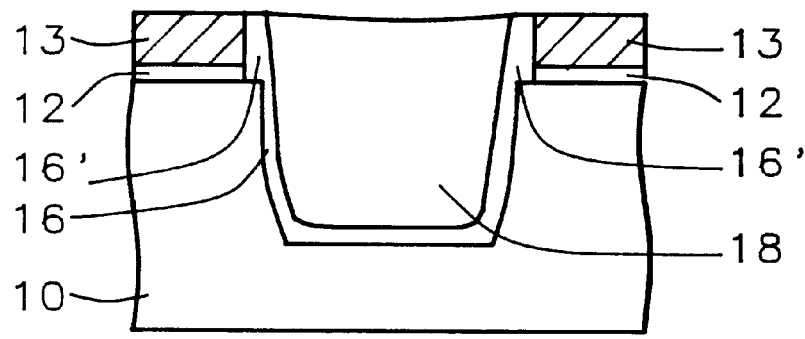

Referring now to FIG. 10A, the gap fill oxide layer 18 is chemical mechanical polished (CMP) back to the silicon nitride layer 14 using an appropriate polishing tool and slurry. Alternatively, as shown in FIG. 10B the gap fill oxide layer 18 can be polished back to the polysilicon layer 13. Since the polish removal rate of silicon oxide to polysilicon is between about 6:1 and 10:1, there is greater processing latitude in polishing back the gap fill layer 18 in the current invention than is achievable in the prior art, thereby providing a more manufacturable process.

Figure 11:
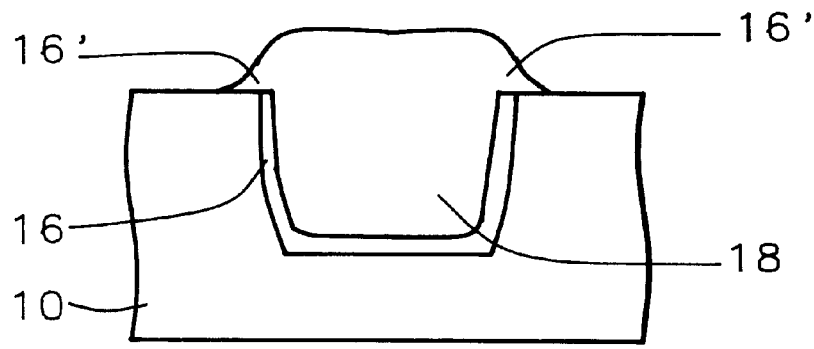

Referring now to FIG. 11, the silicon nitride layer 14, shown in FIG. 10A, is selectively removed using an etching solution of hot phosphoric acid. The polysilicon layer 13 is then selectively removed using a plasma etch (dry etch), such as in a RIE etcher using a selective etch gas containing chlorine and $O_2$, or using an etchant gas mixture such as $HBr/Cl_2/O_2$. Alternatively, the polysilicon layer 13 can also be removed using a wet etch solution of potassium hydroxide (KOH) or a solution containing KOH and IPA. The etch rate selectivity of the polysilicon layer 13 to the gap fill oxide layer 18 is greater than 10 to 1, and therefore provides additional latitude in the polysilicon etching process. In addition, the liner oxide 16 and the liner oxide 16' on the polysilicon layer 13 sidewalls, formed by the thermal oxidation, etch slower than the gap fill oxide 18 during the polysilicon etch. This provides better etch bias control and is a key feature of the invention, since it retains the portion of the thicker field oxide formed from the liner oxide 16 and 16' over the edge A of the device area 3, as shown in FIG. 13 after the polish back and removal of the polysilicon layer 13. Also shown in FIG. 13 by the dashed lines A and B are profiles of the field oxide formed from the gap fill oxide 18 and the liner oxides 16 and 16' after two different CMP rates and removal of the polysilicon layer 13. For example, the dashed lines A and B show the improved profile of the polished back field oxide (layers 18, 16 and 16') for two different polishing rates, such as can occur across the substrate (wafer) due to non-uniform polishing. In both cases the thicker oxide 16' over the silicon edge E is essential to avoid the wraparound corner effect mentioned earlier.

Figure 12:
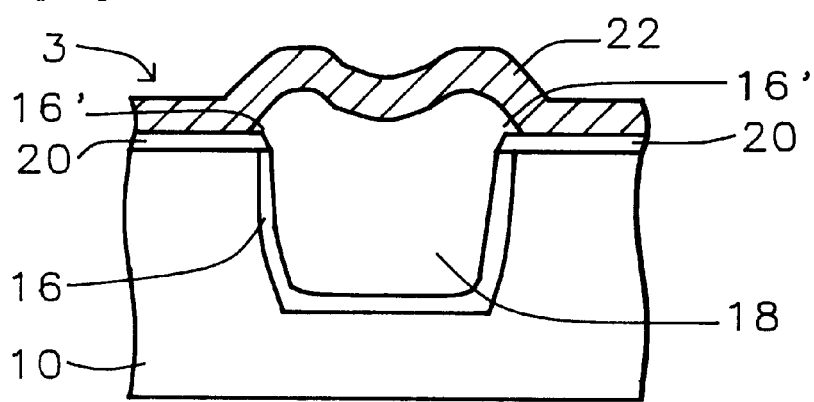

Referring now to FIG. 12, a cross-sectional view is shown through an FET gate electrode 22 formed over two adjacent device areas 3 separated by the field oxide 18 having the improved profile form from the polysilicon oxide 16'. After removing the pad oxide 12, an FET gate oxide 20 is grown having a thickness of between about 50 and 120 Angstroms. The gate electrode 22 is then formed by depositing a second polysilicon layer 22 which is conductively doped and patterned using conventional photolithographic techniques and plasma etching. As can be seen in FIG. 12, the gate electrode 22 is formed over the raised portions having rounded top corners 4 of the field oxide 18 (and 16') which are self-aligned and extend over the device areas 3. This prevents the wrap-around corner effect 2 of the prior art in FIG. 6, and provides much improved FET threshold voltages ($V_{th}$) and better sub-threshold currents when the integrated circuit is completed and powered up.

While the invention has been particularly shown and described with reference to the preferred embodiments thereof, it will be understood by those skilled in the art that various changes in form and details may be made without departing from the spirit and scope of the invention.

What is claimed is:

1. A method for fabricating shallow trench isolation on a semiconductor substrate having raised field oxide regions extending over edges of device areas comprising the steps of:

forming a pad oxide layer by thermal oxidation on said substrate;

depositing a polysilicon layer on said pad oxide layer;

depositing a silicon nitride hard mask layer on said polysilicon layer;

forming trenches in said substrate by photoresist masking and anisotropic etching said hard mask, said polysilicon layer, said pad oxide layer and partially into said substrate, while leaving portions of said polysilicon layer over said device areas;

forming a liner oxide by thermal oxidation in said trenches on exposed surface of said substrate and further concurrently forming a thicker silicon oxide on sidewalls of said polysilicon layer extending over said edges of said device areas;

depositing a conformal chemical vapor deposited silicon oxide and filling said trenches, thereby forming a gap fill oxide;

chemical mechanical polishing back said gap fill oxide to said hard mask removing said hard mask layer by selective etching;

removing said polysilicon layer over said device areas, thereby completing said shallow trench isolation having raised field oxide regions extending over said device areas.

2. The method of claim 1, wherein said pad oxide layer has a thickness of between about 50 and 400 Angstroms.

3. The method of claim 1, wherein said polysilicon layer has a thickness of between about 1000 and 3000 Angstroms.

4. The method of claim 1, wherein said silicon nitride hard mask layer is deposited by chemical vapor deposition to a thickness of between about 1000 and 3000 Angstroms.

5. The method of claim 1, wherein said substrate is single crystal silicon and said trenches are etched to a depth of between about 0.3 and 1.0 micrometers (um) in said substrate.

6. The method of claim 1, wherein said liner oxide is grown to a thickness of between about 300 and 500 Angstroms.

7. The method of claim 1, wherein said gap fill oxide is deposited to a thickness sufficient to completely fill said trenches.

8. The method of claim 1, wherein said chemical mechanical polishing back is carried out using a polishing slurry having a polish rate ratio of silicon oxide to hard mask in a range of 6:1 to 10:1.

9. The method of claim 1, wherein said removing of said portions of said polysilicon layer is by plasma etching having an etch rate ratio of polysilicon to silicon oxide of greater than 10:1.

10. The method of claim 1, wherein said removing of said portions of said polysilicon layer is by wet etching in potassium hydroxide (KOH) having an etch rate ratio of polysilicon to silicon oxide of greater than 10:1.

11. A method for fabricating shallow trench isolation on a semiconductor substrate having raised field oxide regions extending over edges of device areas comprising the steps of:

forming a pad oxide layer by thermal oxidation on said substrate;

depositing a polysilicon layer on said pad oxide layer;

depositing a silicon nitride hard mask layer on said polysilicon layer;

forming trenches in said substrate by photoresist masking and anisotropic etching said hard mask, said polysilicon layer, said pad oxide layer and partially into said substrate, while leaving portions of said polysilicon layer over said device areas;

removing said hard mask;

forming a liner oxide by thermal oxidation in said trenches on exposed surface of said substrate and further concurrently forming a thicker silicon oxide on sidewalls of said polysilicon layer extending over said edge of said device areas;

depositing a conformal chemical vapor deposited silicon oxide and filling said trenches, thereby forming a gap fill oxide;

chemical mechanical polishing back said gap fill oxide to said portions of said polysilicon layer;

removing said portions of said polysilicon layer over said device areas, thereby completing said shallow trench isolation having raised field oxide regions extending over the edges of said device areas.

12. The method of claim 11, wherein said pad oxide layer has a thickness of between about 50 and 400 Angstroms.

13. The method of claim 11, wherein said polysilicon layer has a thickness of between about 1000 and 3000 Angstroms.

14. The method of claim 11, wherein said silicon nitride hard mask layer is deposited by chemical vapor deposition to a thickness of between about 1000 and 3000 Angstroms.

15. The method of claim 11, wherein said substrate is single crystal silicon and said trenches are etched to a depth of between about 0.3 and 1.0 micrometers (um) in said substrate.

16. The method of claim 11, wherein said liner oxide is grown to a thickness of between about 300 and 500 Angstroms.

17. The method of claim 11, wherein said gap fill oxide is deposited to a thickness sufficient to completely fill said trenches.

18. The method of claim 11, wherein said chemical/mechanical polishing back is carried out using a polishing slurry having a polish rate ratio of silicon oxide to polysilicon in a range of 6:1 to 10:1.

19. The method of claim 11, wherein said removing of said portions of said polysilicon layer is by plasma etching having an etch rate ratio of polysilicon to silicon oxide of greater than 10:1.

20. The method of claim 11, wherein said removing of said portions of said polysilicon layer is by wet etching in potassium hydroxide (KOH) having an etch rate ratio of polysilicon to silicon oxide of greater than 10:1.

* * * * *